(12) United States Patent
Lahann et al.

(10) Patent No.: US 6,977,138 B2
(45) Date of Patent: Dec. 20, 2005

(54) REACTIVE POLYMER COATINGS

(75) Inventors: Jörg Lahann, Arlington, MA (US);
Robert Langer, Newton, MA (US);
Klavs F. Jensen, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 189 days.

(21) Appl. No.: 09/912,166

(22) Filed: Jul. 24, 2001

(65) Prior Publication Data

US 2003/0044546 A1 Mar. 6, 2003

(51) Int. Cl.⁷ .......................... C23C 16/448; C08J 7/16
(52) U.S. Cl. ................ 430/322; 427/509; 427/255.6; 427/510; 427/585; 428/421; 428/500
(58) Field of Search ..................... 427/509, 255.6, 427/510, 585; 430/322; 428/421, 500

(56) References Cited

U.S. PATENT DOCUMENTS

| | | | |
|---|---|---|---|
| 5,776,748 A | 7/1998 | Singhvi et al. | 435/180 |
| 5,858,188 A | 1/1999 | Soane et al. | 204/454 |
| 5,869,135 A * | 2/1999 | Vaeth et al. | 427/255.14 |
| 5,935,409 A | 8/1999 | King et al. | 205/560 |
| 6,074,725 A | 6/2000 | Kennedy | 428/188 |
| 6,103,479 A | 8/2000 | Taylor | 435/7.2 |
| 6,192,168 B1 | 2/2001 | Feldstein et al. | 385/12 |
| 6,291,072 B1 * | 9/2001 | Kimoto et al. | 428/422 |

FOREIGN PATENT DOCUMENTS

| | | |
|---|---|---|
| DE | 19604173 | 8/1997 |
| EP | 0 519087 | 12/1992 |
| WO | WO 99/30823 | 6/1999 |
| WO | WO99/40174 | 8/1999 |
| WO | WO00/04389 | 1/2000 |
| WO | WO00/04390 | 1/2000 |
| WO | WO00/53625 | 9/2000 |
| WO | WO00/60356 | 10/2000 |
| WO | WO01/07891 | 1/2001 |

OTHER PUBLICATIONS

"Microengineered Surfaces for Biomedical Applications-Based on a Polymeric Active Ester," Lahann et al. *Polymer Reprints, American Chemical Society.* Jul. 2001. vol. 42, No. 2.

"Bioactive immobilization of r–hirudin on CVD–coated metallic implant devices," Lahann et al. Biomaterials. 2001. vol. 22.

* cited by examiner

*Primary Examiner*—John A. McPherson
*Assistant Examiner*—Daborah Chacko-Davis
(74) *Attorney, Agent, or Firm*—Gauthier & Connors LLP (57) ABSTRACT

A method for coating of variable substrates with highly reactive polymers. Its combination with microcontact printing is used for generating several devices such as patterned arrays of ligands for high throughput screening.

32 Claims, 7 Drawing Sheets

REACTIVE POLYMER COATINGS

BACKGROUND OF THE INVENTION

The invention relates to the field of polymer coating of functional groups made by chemical vapor deposition (CVD) and the use of homogenously distributed functional groups for defined surface design.

Methods for isotropic surface modification of materials are well known, especially plasma aching and plasma polymerization (see Yasuda or EP 0519087 A1). Other widely used methods include laser treatment, ion beam treatment or wet chemical modifications. Another technique is based on the adsorption of self-assembled monolayers, which commonly utilizes substrates made of silicon, silicon dioxide, silver, copper or gold.

The research of thiol monolayers on gold surfaces has resulted in brake-drawing technologies such as soft-lithography. Applications of self-assembled monolayers (SAM's) include sensor development, corrosion protection and heterogeneous catalysis and reference surfaces for biocompatibility studies. SAM's have also been used as templates for organic synthesis and layer-by-layer adsorption. All these techniques are based on a common approach: Spontaneous monolayer formation of thiols on gold to achieve a densely packed two-dimensional crystalline structure offers reactive head groups for further modification.

Rather than pure surface modification, for some applications, surface coating is the method of choice. Surface coating methods include carbon like diamond coatings (CLD), carbon nitride coating, deposition of several metal layers or simple spin, dip, or spray coating of polymers. CVD polymerization coatings of paracyclophane or chlorine derivatives thereof, applied in order to achieve inert surfaces (Swarc, Gorham, Union Carbide) have excellent homogeneity, adhesion and stability. Recently CVD coating of functionalized paracyclophanes has been used in order to immobilize bioactive proteins (Lahann Biomaterials 2001, Höcker, DE 19604173 A1).

This coating procedure developed to be a one-step coating and functionalization method offers a wide range of applications since good bulk properties of a material has been maintained combined with enhanced contact properties. The 'activation' of surfaces with bivalent spacer molecules offers the opportunity of further modification such as drug immobilization. By using the interfaces for immobilization of proteins, cell receptors, cytokines, inhibitors etc., bioactive surfaces that interact with the biological environment in a defined and active matter can be achieved. The activation of the functional groups of the CVD coating with bivalent spacer molecules requires wet chemical procedures and is connected to the use of solvents and harmful monomer molecules. The reaction steps are not sterile and offer a high risk of contamination of the device. While requiring intensive cleaning procedures, again connected to the use of solvents.

The requirement of an additional activation step therefore annuls some of the main advantages of the CVD coating procedure, like ultra-clean coating conditions resulting from the gas phase process without any solvents or additives. In the same manner, the high biocompatibility resulting from those features may be drastically decreased.

CVD-based polymer coatings are used in order to provide amino- or hydroxyl-functionalized surfaces for conjugation of biomolecules. Amino- or hydroxyl-functionalized poly(para-xylylene) coatings however still require an additional activation step for linkage of proteins or ligands. Typically, bivalent spacers such as hexamethylene diisocyanate have been used for amino- or hydroxyl-functionalized polymers. The additional activation step not only limits the feasibility of microengineering, but also causes the contamination of the substrate with organic solvents and volatile chemicals. The contamination reduces crucial advantages of CVD coatings, such as low intrinsic cytotoxicity due to the lack of harmful solvents, initiators, or accelerators during polymerization. Therefore, a one-step coating procedure that provides linkable reactive groups is highly desirable.

The control of engineered microenvironments on device surfaces has been addressed by several approaches including soft lithographic methods such as microcontact printing ($\mu$CP) and micromolding (MIMIC). These procedures have been used for the formation of a wide range of surface patterns, e.g. protein and cell arrays and for micro- and nanofabrication of devices. Potential applications include the regulation of cell shapes, the development of microelectronic elements such as optical displays, circuits, or lasers and the fabrication of complex three-dimensional microstructures or microfluidic devices. One of the most important steps is the spatially controlled self-assembly of monolayers on a substrate. A number of prior art systems have been investigated, however only assemblies of siloxanes on silicon oxide and of alkanethiolates on gold have been widely exploited.

Biomedical devices are typically manufactured from polymers and metals other than gold. Microengineering of patterns is very challenging. The main limitation is the lack of sufficient and homogeneously distributed functional groups on the substrate surface, which are necessary for the build-up of further structural elements. Treatment with high-energy sources such as plasma, laser, or ion beams has been used to create functionalized surfaces for biomedical systems. Poly(ethylene terephthalate) is surface-modified via multi-step synthesis to generate a surface for $\mu$CP of biological ligands. Patterns of proteins or cells have been also generated by means of photolithographic techniques. Examples include the spatially controlled photoablation of previously adsorbed proteins and the linkage of proteins via photosensitive groups. Photolithography however tends to be laborious and expensive. Over the past few years, the combination of chemisorption of alkanethiolates onto gold surfaces and soft lithographic methods has been shown to be a versatile technique for fabrication of patterned surfaces. Among soft lithographic methods, microcontact printing ($\mu$CP) of alkanethiolates to gold or silver substrates has been most intensively used for generating patterns of various mammalian cells. Although immensely important for a broader fundamental understanding of cell shape, position and function, the biomedical applications of these techniques are limited by relevant devices being mostly manufactured out of materials other than gold or silver.

The predictable design of a surface with different domains of functionality is a much stronger approach, since it opens the entrance to microstructured surfaces. It combines the chemical flexibility of adsorption-based techniques such as SAM on gold with the mechanical stability of a robust CVD-polymer coating. Generally, a generic method to fabricate patterns of proteins and/or cells based on reactive coating and spatially directed self-assembly includes generating a pattern of endothelial cells via a three-step procedure. First, a substrate is coated by a polymer presenting chemically reactive pentafluorophenol ester groups (reactive coating). Second, patterns are created by microcontact printing ($\mu$CP) of amino-derived biotin ligands. Streptavidin is subsequently bound to the biotin-exposing surface regions and served as a linker providing free biotin-binding sites, which are used to bind a biotin-tethered antibody against α-integrin. The specific interaction of the antibody with α-integrin located on the surface of endothelial cells is used for the spatially controlled deposition of cells.

The ability to generate patterns of biological ligands, proteins or cells on surfaces is important for several technologies in biomedical engineering such as the development of certain types of biosensors or fundamental studies of cell biology. The spatially controlled attachment of ligands is also necessary for some biological assays and for combinatorial screening of drugs. In tissue engineering, the formation of tissue or organized cell structures often requires a specific architecture that allows cells to occupy defined locations on a construct, while preventing non-specific adhesion. PCT/US99/15968 discloses arrays of protein-capture agents, which are useful for the simultaneous detection of a plurality of proteins. The arrays comprise a thin organic layer that is between 10 and 20 mm thick. The use of monomolecularly dimensioned interlayers is associated with disadvantages described for self-assembled monolayers. SAM's are restricted to a few substrate materials; porous structures such as foams, scaffolds or membranes are difficult to process and applications in chemically aggressive environments such as in vivo are not possible. The herein disclosed methods allow for overcoming these backdraws.

U.S. Pat. No. 6,103,479 (Taylor) discloses miniaturized cell array methods and apparatus for cell-based screening. These devices can be used with methods of performing high-throughput screening of the physiological response of cells to biologically active compounds and methods of combining high-throughput with high-content spatial information at the cellular and sub-cellular level as well as physiological, biochemical and molecular activities.

Other prior art references which generally describe cell arrays and methods and apparatus to use the same include WO 01/07891 (Kapur et al.), WO 00/60356 (Kapur et al.), U.S. Pat. No. 5,776,748 (Singhvi et al.), and WO 00/53625 (Rossi et al.). However, all of these references include multi-step processes and include the use of solvent.

U.S. Pat. No. 6,192,168 (Feldstein et al.) describes a reflectively coated optical waveguide and fluidics cell integration, which includes a waveguide having a patterned, reflective coating.

Electrophoresis is an indispensable tool of biotechnology as described in PCT Pub. No. WO 99/40174. The devices are used in a variety of applications and preparation of pure samples of nucleic acids, proteins, carbohydrates, the identification of a particular analyte in a complex mixture and the like. They are also used in capillary electrophoresis (CE) and microchannel electrophoresis (MCE). These methods are used for industrial processes and basic research including analytical, biomechanical, pharmaceutical, environmental, molecular, biological, food and clinical applications.

U.S. Pat. Nos. 5,858,188 and 5,935,409 further describe microchannels and their use in electrophoresis and processes for recovering metal values from metal sources containing more than one metal.

Additional references in the field of cell assays include PCT Pub. Nos. WO 00/60356 and WO 01/07891. These disclose methods for making a substrate for selective cell patterning and the substrates themselves; and for array for cell screening and methods of making them, respectively.

Arrays of protein-captive agents are useful for simultaneous detection of a plurality of proteins which are expression products or fragments thereof, of a cell or population of cells as described in PCT WO 00/04389. The arrays are useful for various proteomic applications including assessing patterns of protein expression and modification in cells.

SUMMARY OF THE INVENTION

A one-step CVD coating process such that the coating has polymer interfaces that contain chemical groups having sufficient intrinsic reactivity to react with target molecules under mild conditions without the need to use additional activation reagents. The highly reactive surfaces are useful for several applications such as the manufacturing of cell arrays, immobilization of drugs for tissue engineering, micro-reactors, surfaces for protein or DNA screening or electro-optical devices.

Cell adhesion is a specific process that involves interactions between cell adhesion mediators (fibronectin, laminin, collagens etc.) and cell surface receptors (CSRs) comprising cadherins, integrins, immunoglobulins, or selecting. CSRs possess specific binding sites for extracellular matrix proteins and their expression varies with cell type. While some CSRs are expressed almost universally (e.g., laminin receptors), others are specific for a cell type. For example, fibronectin receptor VLA-5 is expressed by only a few cell types including endothelial cells, epithelial cells, platelets, and fibroblasts. VLA-5 is formed on the cell surface by association of $\beta_1$-integrin with $\alpha_5$-Integrin being itself a dimer of 135/25 kD. The specificity of these integrins may be advantageously used to control cell adhesion. A surface-bound antibody against the VLA-5 receptor fragment $\alpha_5$-Integrin (human anti-$\alpha_5$-integrin) induces attachment of endothelial cells having $\alpha_5$-integrin exposed on their surface.

When chemically addressable surfaces are needed, CVD polymerization of functionalized [2.2]paracyclophanes can be utilized. The technique has been used for coating several materials with polymers (reactive coating). CVD can be exploited to pattern biotin-ligands on the coated surface. The use of the microstructured surfaces as templates for layer-by-layer self-assembly of proteins and cells present a new path toward spatially directed cell attachment. Since the coating step is substrate-independent, the technology may provide a generic approach to microstructuring of biomaterials. While overcoming restrictions associated with gold/alkanethiolates-based techniques, the technology maintains intrinsic advantages of soft lithography, e.g. accuracy, broad availability, and low costs.

It is an object of this invention to provide a one step CVD process resulting in a reactive coating.

It is another object of this invention to provide the reactive coating on essentially any shaped three dimensional or porous structure.

It is another object to provide a simple, inexpensive quick scale-up method of producing a chemically addressable surface.

Additionally it is another object to provide applications for the herein disclosed methods.

BRIEF DESCRIPTION OF THE DRAWINGS

Other objects, features and advantages of the present invention will become more apparent as the description proceeds with reference to the accompanying drawings, wherein.

DESCRIPTION OF THE PREFERRED EMBODIMENT

Universal applicability of the reactive coating to various substrates, such as polymers, metals or composites makes the procedure described below attractive for tissue engineering. In addition, the use of a cell-specific antibody constitutes a first step towards co-colonization of different cell types.

Generally, the interfaces contain functional groups, that are capable to react with functional groups of a target molecule resulting in stable chemical linkages and are produced by chemical vapor deposition. The reaction of the interface with the drug does not need a further wet chemical activation step that is connected to the use of any aggressive reagents or medium beside the interface and the drug. It will either occur spontaneous or only requires illumination with light (structures (16) to (24)). The reaction of the interface with the drug may be carried out in aqueous solution ideal for applications associated with proteins, peptides or DNA. The monomer units may be achieved either by thermal or photochemical activation of suitable precursors (usually paracyclophanes) in a CVD process. All interfaces are based on poly(para-xylylene)s or copolymers thereof. The interface are built up by polymers that contain one or more different repetition units, where at least one of the repetition units is selected from the chemical structures (1) to (24) (as shown below), while other repetition units can be variably designed, although para-xylylene is the mainly suitable repetition unit.

1

2

3

4

5

6

R: hydrogene atom, alkyl, aryl, benzyl, halogen, hydroxyl, alkoxyl

7

8

9

10

11

$R_1$, $R_2$, $R_3$, $R_4$, $R_5$ independently are: hydrogene atom, alkyl, aryl, benzyl

13

14

15

R: F, CH$_3$, CF$_3$, C$_4$F$_9$, CH$_2$CF$_3$, C$_2$F$_5$,
(CH$_2$)$_n$NR$'_2$(R': hydrogene atom, alkyl,
aryl, benzyl)

16

R: CH$_3$, H, CF$_3$, NO$_2$, Br, F, Cl, I

16

$R_1$, $R_2$, $R_3$, $R_4$ independently are: hydrogene atom, alkyl, aryl, benzyl, halogen, hydroxyl, alkoxyl, thiol, thioether, amino, nitro
n: 0 or 1
$R_5$: hydrogene atom, alkyl, alkenyl, benzyl, halogene, alkoxyl,

17

18

19

20

21
22
23
24

Figure 1:
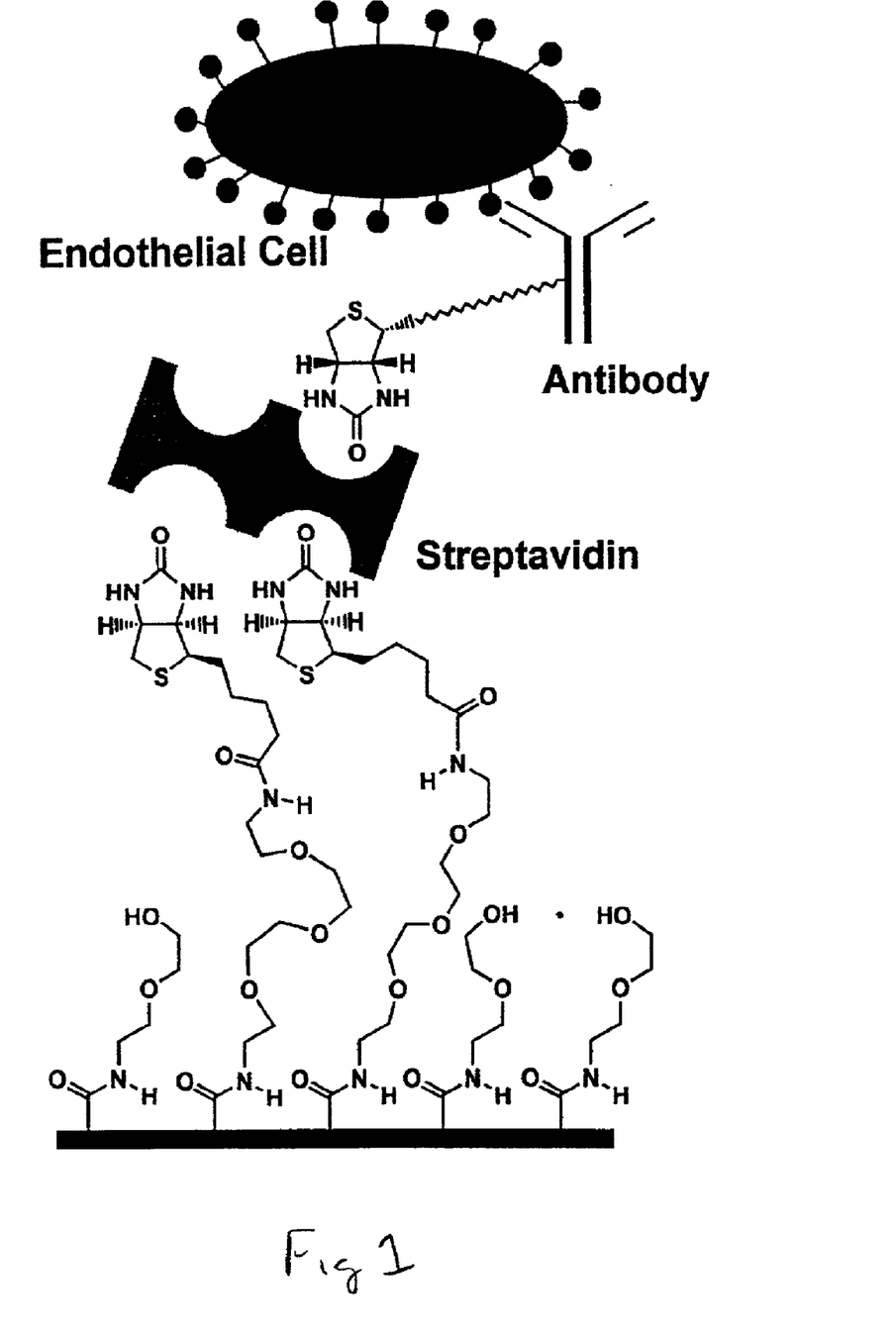
FIG. 1 is a chemical structure of a polymer used as reactive coating for the spatially controlled design of surfaces.

Engineered microenvironments based on coating with poly[para-xylylene carboxylic acid pentafluorophenolester-co-para-xylylene] as shown in FIG. 1 are described. For spatial control of cell attachment, surface patterns of antibody are designed. The patterns are achieved by reactive coating, μCP of amino-derived biotin-ligands and layer-by-layer self-assembly on patterned surfaces. Since the first step involves the coating of the surface, the procedure is independent from the substrate material. Poly[para-xylylene carboxylic acid pentafluorophenolester-co-para-xylylene] is used as reactive coating. The coating provides active ester groups on the surface, which are suitable for straightforward linkage of biomolecules presenting amino groups.

Figure 3A:
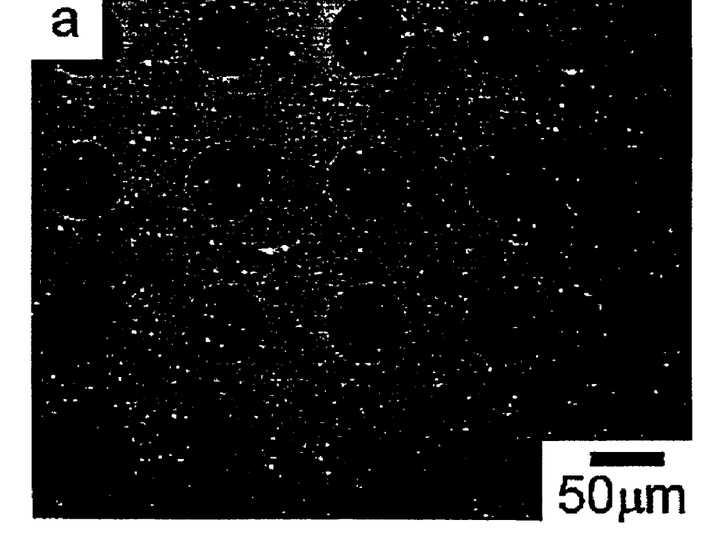
FIGS. 3a and b are schematic representations of a spatially controlled surface modification of a substrate coated with polymer by means of μCP.
Figure 3B:
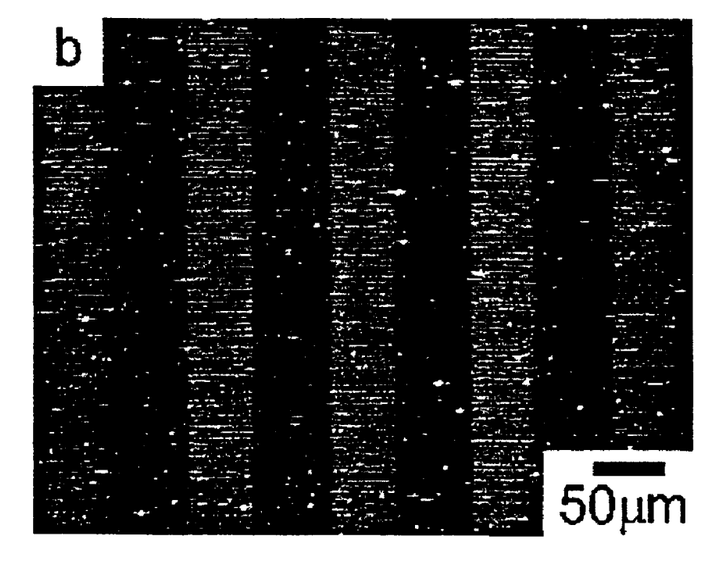

FIGS. 3a and 3b illustrates patterns of spatially controlled surface modifications of a substrate coated with a polymer by means of μCP.

[2.2]paracyclophane-4-carboxylic acid pentafluorolphenolester is synthesized from [2.2]paracyclophane via a three-step synthesis. Friedel-Crafts acylization of [2.2] paracyclophane with trifluoroacetic acid anhydride, using an excess of $AlCl_3$ results in 4-trifluoroacetyl [2.2] paracyclophane. Hydrolysis of 4-trifluoroacetyl [2.2] paracyclophane to 4-carboxy [2.2]paracyclophane and subsequent conversion with pentafluorophenol trifluoroacetate led to the final product.

The coating is homogenously deposited on the substrate by means of CVD polymerization of [2.2]paracyclophane 4-carboxylic acid pentafluorophenolester. To coat a substrate with the reactive coating, starting material is pyrolyzed in the vapor phase to form the corresponding para-quinodimethanes, which condensed onto the substrate and spontaneously polymerized. During the polymerization, the temperature of the substrate is controlled to be below 45° C. The relatively low substrate temperature allows coating of temperature-sensitive substrates (e.g. poly(lactic acid)) without decomposition. Exploitation of functionalized [2.2] paracyclophanes for CVD polymerization is generally limited by the requirement to preserve integrity of the functional groups under the conditions of quinodimethane creation in the pyrolysis zone.

CVD polymerization of [2.2]paracyclophane 4-carboxylic acid pentafluorophenolester results in a vacuum-deposited film of polymer Poly[para-xylylene carboxylic acid pentafluorophenolester-co-para-xylylene] on the substrate (FIG. 1). Purified [2.2]paracyclophane 4-carboxylic acid pentafluorophenolester (dimer) is sublimated under a reduced pressure of less than 100 Pa at temperatures below 150° C. The sublimated material [2.2] paracyclophane 4-carboxylic acid pentafluorophenolester is transferred to the pyrolysis zone, which is heated above 550° C. to ensure cleavage of the C—C bonds resulting in the corresponding quinodimethanes (monomers). In the last step, monomers are adsorbed on the substrate at temperatures around 45° C. and spontaneously polymerized.

The pyrolysis temperature is crucial for the quality of the reactive coating: pyrolysis is best conducted at a temperature above 550° C. and below 900° C. When synthesized under these conditions, the chemical composition of 4-trifluoroacetyl [2.2]paracyclophane is usually in good accordance with the theoretically expected values as determined by X-ray photoelectron spectroscopy (XPS). The IR spectrum of polymer 4-trifluoroacetyl [2.2]paracyclophane confirms the presence of the intact ester bond as indicated by a characteristic signal at a wavelength of 1762 cm$^{-1}$ and the characteristic bands of C—F stretching vibrations are at wavelengths between 997 and 1036 cm$^{-1}$. The incorporation of pentafluorophenol ester groups in the side chain of polymer 4-trifluoroacetyl [2.2]paracyclophane creates a chemically reactive interface. Immobilization of amino-containing molecules to the coated substrate does not require further activation steps, as they would have been necessary for amino- or hydroxyl-functionalized poly(p-xylylene) coatings. The absence of activation steps prevents contamination of the substrate with organic solvents and volatile chemicals and preserves some of the intrinsic advantages of CVD coatings such as low cytotoxicity due to the lack of harmful solvents, initiators, or accelerators during polymerization.

CVD polymerization of [2.2]paracyclophane 4-carboxylic acid pentafluorophenolester results in transparent and topologically uniform polymer films having thicknesses between 40 and 2000 nm. The film thickness is mainly determined by the amount of [2.2]paracyclophane 4-carboxylic acid pentafluorophenolester used for polymerization. The thickness of a film produced by the deposition of 30 mg of [2.2]paracyclophane 4-carboxylic acid pentafluorophenolester is examined by means of spectroscopic ellipsometry (SE) and is 190.0(±5.8) nm. Atomic force microscopy is used to characterize the surface topology: The root-mean square roughness is determined to be 0.4 nm (1 $m^2$ spot). The reactive coating shows excellent chemical stability in a dry air environment. No significant change in composition or chemical behavior is found for samples stored in a dry air atmosphere for several weeks as compared to freshly prepared samples.

The reactive coating shows excellent adhesion on various substrates, such as poly(dimethylsiloxane) (PDMS), poly (tetrafluoroethylene), poly(carbonate), chrome nitride, gold and silicon. Polymer Poly[para-xylylene carboxylic acid pentafluorophenolester-co-para-xylylene] is insoluble in common solvents, e.g. dimethylformamide, chloroform, acetone, ethanol or aqueous solutions. Incubation of a gold substrate coated with polymer Poly[para-xylylene carboxylic acid pentafluorophenolester-co-para-xylylene] in an aqueous PBS buffer (pH 7.4) for 7 d at room temperature did not affect its mechanical stability. Similarly, the reactive coating shows excellent adhesion after Soxhlet extraction for 6 h in acetone. Adhesion of the reactive coating to the gold substrate is examined by gently pressing a 1 $cm^2$ area of a Scotch tape onto the polymer coating. After subsequently peeling off the tape, the sample is examined by optical microscopy and infrared spectroscopy and is mechanically and chemically intact. Prior to coating in the vapor deposition process, pretreatment of the substrate may be used to improve adhesion behavior. The method of choice is mainly depending on the type of substrate and all methods well-known to a person skilled in the field of adhesion improvement may be applied. Especially a pretreatment with cold gas plasmas, such as oxygen, hydrogen, nitrogen, ammoniac, carbon dioxide, ethylene, acetylene, propylenes, butylenes, ethanol, acetone, sulfur dioxide or mixtures thereof have proven themselves to be advantageous in improving the adhesion behavior of the deposited polymer coatings.

Figure 2:
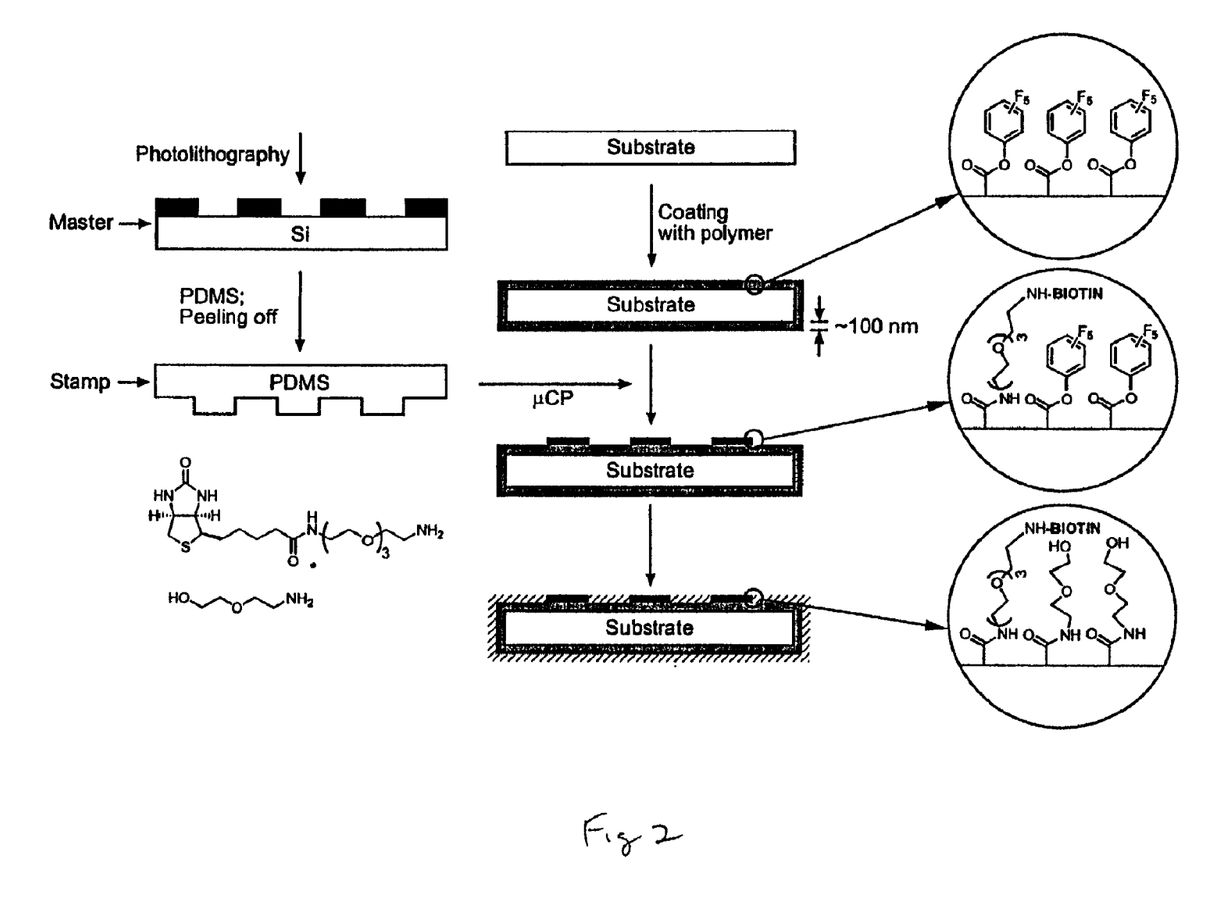
FIG. 2 is a spatially controlled surface modification of the reactive coating covering a substrate using μCP.

(+)-Biotinyl-3,6,9-trioxaundecanediamine is used for $\mu$CP of different patterns on gold substrates coated with polymer Poly[para-xylylene carboxylic acid pentafluorophenolester-co-para-xylylene] (FIG. 2). Biotin-based ligands are used because biotin is a prototype of a small ligand and its interaction with streptavidin is characterized by strong non-covalent interaction and allows the facile patterning of streptavidin on the surface. Streptavidin is a widely used immobilization protein that has two pairs of binding sites on opposite faces and therefore represents a universal platform for further patterning of biotin-labeled biomolecules. Fluorescein-labeled streptavidin is used to examine the micropatterns. A PDMS stamp is casted from a photolithographically produced silicon master. Prior to use, the PDMS stamp is oxidized by means of an oxygen plasma. Ligand, (+)-biotinyl-3,6,9-trioxaundecanediamine is printed via PDMS stamp on the substrate surface coated with polymer poly[para-xylylene carboxylic acid pentafluorophenolester-co-para-xylylene]. The contact time is 60 s. Subsequently, the remaining pentafluorophenol ester groups are reacted with 2-(aminoethoxy)ethanol to passivate non-printed areas of the surface. The covalent nature of the linkage of the amino-ligands to the reactive coating is examined by IR spectroscopy. After $\mu$CP of ligand, (+)-biotinyl-3,6,9-trioxaundecanediamine for 60 s, the IR spectrum of polymer poly[para-xylylene carboxylic acid pentafluorophenolester-co-para-xylylene] shows characteristic bands at wavelengths of 1653 and 1578 $cm^{-1}$ indicating primary amide bounds. By patterning the substrate into regions that alternately promote or prevent the binding of streptavidin, spatially controlled self-assembly is expected to occur. A patterned substrate is then incubated with fluorescein-conjugated streptavidin in PBS buffer (pH=7.4) containing 0.1% (w/v) bovine serum albumin and 0.02% (v/v) Tween 20. Fluorescence microscopy is used to visualize the microengineered patterns. As shown in FIG. 3, the fluorescein-labeled streptavidin is spatially restricted to the biotin-coated areas of the substrate surface. Sharp contrasts are observed. Both micrographs demonstrate homogeneity and reproducibility of the reactive coating on the substrate.

A unique and basically substrate-independent technique toward reactive coatings is developed and used for spatially designed microenvironments. The resulting surfaces may have value for several biomedical applications such as tissue engineering, drug development or molecular diagnostics. The use of various co-polymers allows a broad range of applications. Those co-polymers can be composed of two or more polymers with intrinsic reactivity toward target molecules, or one or more polymers with intrinsic reactivity toward target molecules in combination with one ore more polymers that lack intrinsic reactivity toward target molecules. Polymers that are lacking intrinsic reactivity due to the absence of highly reactive functional groups can be poly(p-xylylenes), poly(olefin) such as polystyrene, polyethylene, polyacetylene, polybutadiene, etc. These polymers may have functional groups that do not have the high intrinsic reactivity to react per se with target molecules. The functional groups may be The polymers may be selected from the following COOMe, $NO_2$, $(NO_2)_2$, $NH_2$, $(NH_2)_2$, SH, $CH_2OMe$, $CH_2OCOCH_3$, $CH_2OCOCF_3$, $COCF_3$, $CH_2OH$, $(CH_2OH)_2$, Br, $(Br)_2$, lactone, CN. Although polymers of the type, proposed in DE 19604173 A1 are suitable polymers lacking intrinsic reactivity toward target molecules. The use of these co-polymers may be advantageous for applications were a decreased density of functional groups on the surface is intended or where a subtly differentiated reactivity pattern is used to bind several different target molecules in a defined manner.

Discussion of Experimental Results

A) [2.2]Paracyclophane-4-carboxylic acid pentafluorophenolester: A solution containing 4-carboxy [2.2] paracyclophane (1 g, 3.94 mmol), pentafluorophenol trifluoroacetate (0.7 ml, 4.07 mmol) and pyridine (0.4 ml, 5.0 mmol) in tetrahydrofuran (10 ml) is stirred at room temperature for 12 h. The solution is concentrated under reduced pressure and the remaining crude product is dissolved in ethyl acetate (35 ml). Extraction with ethyl acetate and subsequent column chromatography delivered 1.15 g of product [2.2]paracyclophane-4-carboxylic acid pentafluorophenol-ester (88%). $^1$H NMR (300 MHz, $CDCl_3$, TMS): $\delta$=2.92–2.99 (1H, $CH_2$), 3.07–3.23 (6H, $CH_2$), 4.10 (1H, $CH_2$), 6.51 (1H, CH), 6.54 (1H, CH), 6.60 (1H, CH), 6.65 (1H, CH), 6.68 (1H, CH), 6.81 (1H, CH), 7.39 (1H, CH); $^{13}$C NMR (75 MHz, $CDCl_3$, TMS) $\delta$=34.80, 35.32, 35.45, 36.38, 125.79, 127.50, 131.74, 132.51, 133.28, 133.53, 136.59, 136.81, 138.01, 138.52, 139.71, 139.94, 140.10, 140.12, 140.80, 141.24, 143.50, 145.10, 159.51; IR (KBr): $\nu$=513, 630, 693, 790, 852, 902, 994, 1040, 1122, 1163, 1255, 1516, 1757, 2853, 2898, 2926, 2955, 3015 $cm^{-1}$; MS (70 eV): m/z=418 ($M^+$), 314 ($C_8H_7CO_2C_6F_5^+$), 251

($C_{16}H_{15}CO_2^+$), 235($C_{16}H_{15}CO^+$), 131($C_8H_7CO^+$), 104 (main, $C_8H_8^+$), 77 ($C_6H_5^+$).

B) Poly[para-xylylene carboxylic acid pentafluorophenolester-co-para-xylylene]: [2.2] paracyclophane 4-carboxylic acid pentafluorophenolester is polymerized using a self-designed CVD installation consisting of a sublimation zone, a pyrolysis zone and a deposition chamber. Compound [2.2]paracyclophane-4-carboxylic acid pentafluorophenolester (30 mg, 0.07 mmol) is placed in the sublimation zone and a sample, e.g. a gold-coated silicon substrate is fixed in the deposition chamber at 45° C. The pressure is adjusted to 0.2 mbar and the pyrolysis zone is heated to 550–600° C. Subsequently, [2.2]paracyclophane-4-carboxylic acid pentafluoro-phenol-ester is sublimated slowly by increasing the temperature of the sublimation zone from 120 to 130° C. Under these conditions, the deposition rate is 0.4 Å/s. SE is done on a variable angle spectroscopic ellipsometer (J.A. Woollam Inc., USA) using a Cauchy model for curve fitting. AFM studies are conducted in tapping mode on a NanoScope III (Digital Instruments Inc., USA).

XPS (atomic ratios): $F_{1s}/C_{1s}$: 31.7% (calculated: 21.7%), $O_{1s}/C_{1s}$: 7.4% (calculated: 8.7%), C—F/C—C: 28.3% (calculated: 31.3%), C—O/C—C: 5.7% (calculated: 6.3%), C=O/C—C: 5.4% (calculated: 6.3%); IR (grazing angle of 85°): v=658, 829, 997, 1036, 1176, 1246, 1450, 1471, 1497, 1523, 1762, 2862, 2931, 3025, 3054 cm$^{-1}$.

Below are a number of examples of how microstructured surfaces may be utilized:

EXAMPLE 1

Using mask techniques as known from microlithography during the CVD coating, a microstructured surface consisting of two poly(p-xylylene)s, defined as area A and B etc. with two different types of functional groups can be created (e.g. carboxylic and amino groups: see FIG. 1). Since both types of functional groups can be activated separately the independent immobilization of two or more peptides, proteins, cell receptors, cytokines, inhibitors oligonucleotides, DNA strains, polysaccharides, etc. is possible. This offers an independently tunable interaction of different surface areas with cells. For instant cell adhesion receptors may be immobilized on area A, whereas adhesion inhibitors are immobilized on area B, and so on.

For some applications a strict separation of different types of functional groups may not be suitable. In those cases it is also possible to design areas containing mixtures of different functional groups. Alternatively a coating containing repetition units selected from structures (16) to (24) was deposited on a substrate an patterns were created photolithographically using conventional mask techniques as known to a person skilled in the field.

EXAMPLE 2

Instead of using mask techniques, microstructuring may be achieved by stamping using e.g. a PDMS or poly (urethane) stamp. This technique may be conducted in two variations. First, an activated poly(p-xylylene) surface can be patterned with a stamp that is previously exposed to a target molecule. Second, a per se non-reactive poly(p-xylylene) surface is activated using a stamp. Subsequently, the whole surface area is exposed to a solution containing the target molecule.

EXAMPLE 3

Micro-structuring is achievable by selective growth of poly(p-xylylene) as a pretreatment of the substrate with a polymer inhibitor which selectively avoids the polymer coating of certain areas. Mainly metal salts are known to induce selective growth for unsubstituted poly(p-xylylene). Other radical catcher or retarder, such as hydroquinone may be suitable. This may vary such that known patterning techniques such as self assembled monolayer of alkanthiolate may be used to pattern a surface. The alkanethiolates are equipped with head groups that selectively bind metal salts (e.g. mercapto-alkyl acids). The basic technique is disclosed by Jensen et al.

EXAMPLE 4

Microstructuring can also be achieved by controlling the temperature of the substrate in a defined manner. That is possible, since the CVD polymerization is temperature depending and different poly(p-xylylene)s have different condensation temperatures. This offers also the entrance to 3-dimensional microstructured surfaces as usable for tissue engineering.

EXAMPLE 5

Microstructuring can also be achieved by using laser induced CVD polymerization of functionalized paracyl-cophanes. The actual microstructuring is achieved by applying the laser beam only to defined areas of the substrate. This offers a very easy entrance to multiple functionalized surfaces.

EXAMPLE 6

After a microstructured surface according to one of the former examples is achieved, photoactivateable linker can be used for protein immobilization. The gradual application of UV energy creates a gradient with respect to the amount of immobilized protein. The gradients in immobilized growth factors can be used for nerve cell regeneration (see application 2).

EXAMPLE 7

Microstructured surfaces according to one or more of the former examples can be used in order to induce graft-copolymerization of variable polymers. A defined 3-dimensional polymeric structures is achievable. The use of those functional groups for the polymerization of elctroconductive polymers offers a wide range of applications (see application 4). A cotton swab is wetted with a solution of modified soluble polyacetylene in ethanol (0.05%) and dragged once across the patterned side of the stamp. The stamp is dried with a stream of nitrogen for 20 s and pressed onto PTFE surface coated with reactive coating for 60 s. The sample is immersed immediately in a solution of PEG in anhydrous dimethylformamide (DMF) (10 mM) for 4 h. The sample is removed, rinsed with distilled water and used for further application.

In addition to the above examples below are descriptions of typical uses of the microstructured surfaces.

Figure 4:
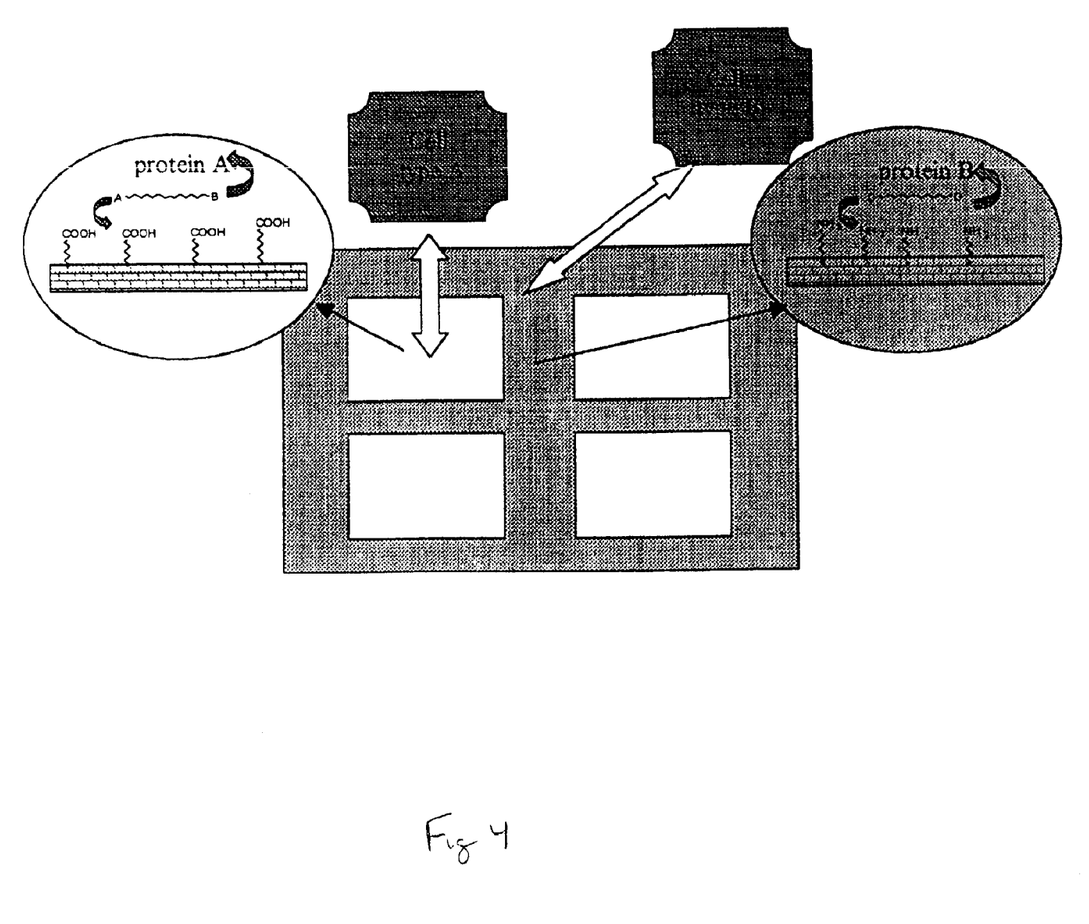
FIG. 4 is a schematic drawing of designed used for tissue engineering.

Application 1:

The use of two or more growth factors being specific for a given cell type offers the opportunity of co-cultures of different cells wherein different cells are located in a completely defined matter as illustrated in FIG. 4. The surfaces are new in tissue engineering and offer advanced artificial tissues. The tissue engineering of cartilage is a optimal field of application, since two different cells (osteocytes and condocytes) are necessary in order to achieve proper working cartilage.

Figure 5:
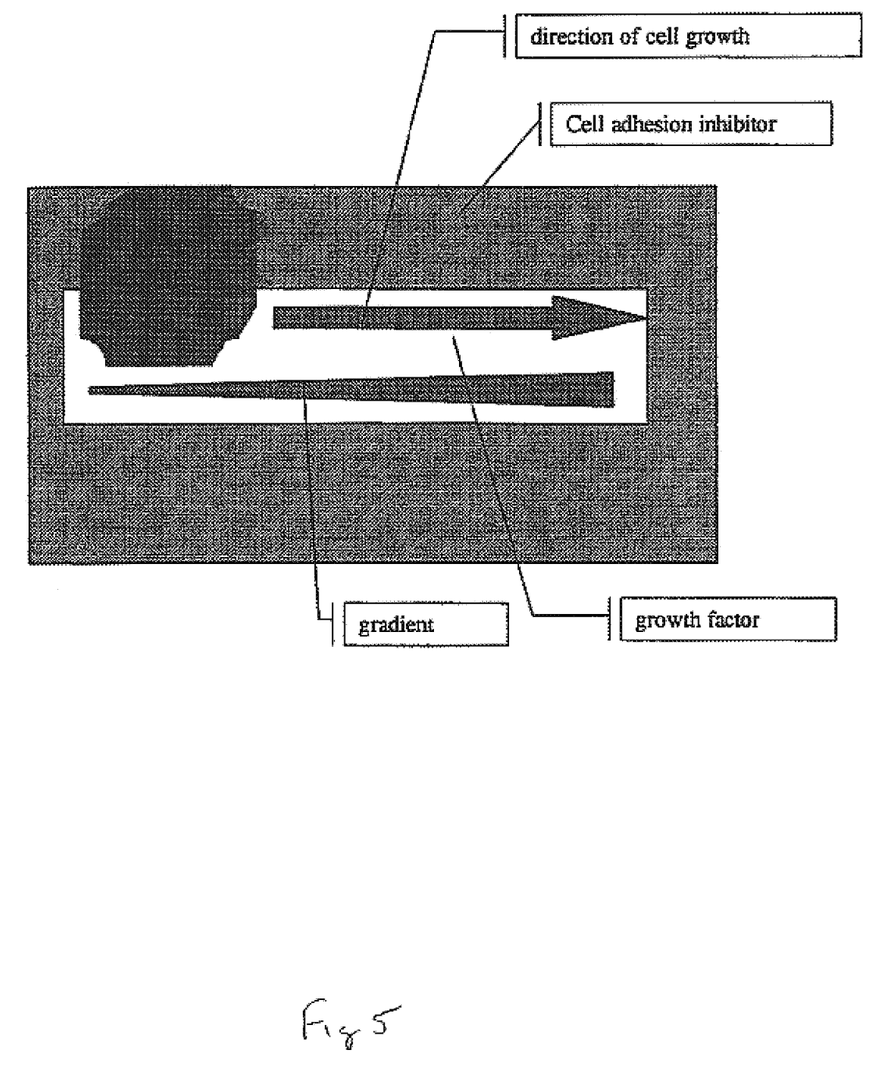
FIG. 5 is a schematic drawing of cell adhesion inhibitors for tissue engineering.

Application 2:

As shown in FIG. 5, the combined use of several growth factors (e.g. NGF, BDNF or TN-3) in combination with cell adhesion inhibitors being specific for a given cell type offers the opportunity of tissue engineering of cells, that are extremely depending on their environment as well as on their direction of growth. Such interfaces can be applied to tissue engineering of nerve cells. Especially the feature of achieving a gradient with respect to the concentration of the growth factor may be decisive for nerve regeneration.

Application 3:

A $SiO_2$-based in vivo-device for drug delivery is developed by Langer and Santini ("microchip"). One of the main challenges of the device is the poor biocompatibility of $SiO_2$, the base material of the device. Alternatively, when using CVD-coating and subsequent immobilization of variable bioactive molecules, interaction with the surrounding tissue may be utilized in a predictable manner. Immobilization of cell adhesion mediators or growth factors to the backside will reduce biomaterial induced body reactions such as inflammation or encapsulation whereas the front sight is designable such that cell adhesion and protein adsorption is minimized. This prevents the inhibition of drug release by encapsulation or cell ingrowth.

Application 4:

By using the microstructured surfaces for the initiation of electroconductive polymers "polymeric wires" with a high degree of structural order can be achieved. This offers the entrance to completely polymer-based circuits, even for microscale applications.

The technique offers potentially the same applications than micro-contact printing/SAM such as two-dimensional patterning, sensor development, nano-fabrication etc.

Application 5:

A PDMS device for DNA screening including a 64×64 channel PDMS setup with a depth of ca. 100 m. Each membrane is built up with 4 different functional groups. 256 membranes are aligned in batch process resulting in $4^8$ different possibilities for DNA screening. The substrates are size: 8×8×3 cm and are made of a material (PDMS) that is 50 times cheaper than silicon. CVD-coated PDMS devices are incubated for 4 h in a solution of 2-aminoethoxyethanol (10 mM in DMF). After rinse several times with PBS patterned samples are incubated in sterile petri dishes with PBS buffer (pH 7.4) containing 0.1% (w/v) bovine albumin and 0.02% (v/v) Tween 20 for 30 min, and with a solution of streptavidin (10 mM, Pierce, USA) in PBS buffer containing 0.1% (w/v) bovine serum albumin and 0.02% (v/v) Tween 20 for another 60 min. The surface is rinsed several times with PBS and then exposed for 120 min to a solution of Biotin-DNA oligomers (0.5 mM) in TE buffer (10 mM Tris HCl, 1 mM EDTA, PH=8). The samples are rinsed in TE buffer. A drop (10 $\mu$l) of fluorescence-DNA oligomer solution mixed with 10 $\mu$l of TE buffer is dropped onto the surface for 2 h. The samples are rinsed very well with TE buffer and examined by fluorescence microscopy using a HFX-DX fluorescence microscope (Nikon, Japan).

Application 6

Microfabrication techniques and scale-up by replication have fueled spectacular advances in the electronics industry, and they are now creating new opportunities for reaction engineering. The term "microreactor" typically relates to a small tubular reactor for testing catalyst performance.

Microfluidics, the manipulation of liquids and gases in channels having cross-sectional dimensions on the order of 10–100 $\mu$m, will be a central technology in a number of miniaturized systems that are being developed for chemical, biological, and medical applications. These applications can be categorized into four broad areas: miniaturized analytical systems, biomedical devices, tools for chemistry and biochemistry, and systems for fundamental research. In order for these systems to be successful, they must have the attributes that are required for the particular application, e.g. optical properties and surface chemistry, and they must also be fabricated in materials that are inexpensive and rugged and use processes that are amenable to manufacturing. A suitable microreactor design may include an active ester coated PDMS substrate. An amino-coated PDMS substrate is utilized and optionally rinsed with ethanol. The pieces are aligned and glued together resulting in a simple technique for manufacturing complex devices. A solution of an biotin-conjugated mouse anti-human monoclonal antibody, is flown into the microchannel for 2 h. Surfaces exposing patterns are incubated with a suspension of bovine aortic endothelial cells (BAECs) in serum-free Dulbecco's modified eagle medium (DMEM). After 24 h, cell attachment is studied by means of immunofluorescence microscopy. Cell nuclei are stained with bis-benzimide.

Application 7

An electrophoresis chambers designed as a PDMS based device. It is CVD-coated providing functionalities as of demand. Functional groups are used to enhance surface properties (optional). The surface is stable and there is no re-orientation of surfaces due to environment.

Application 8

A functionalized nanofabrication is made by using elastomeric Poly-p-xylylene made by CVD. A replica is prepared by lithographic methods Followed by pre-coating of the surface to decrease adhesion (optional). A CVD-coating is applied with a sufficiently thick layer. The coating is peeled-off and then sealed or modified by second, third, etc. CVD coating steps. This includes inert, stable polymer with elastomeric properties and reactive surfaces for (i) binding of reactants (ii) further construction. It is possible to combine with any flat substrate surface.

Application 9

Protein Screening with Micro-reactors

A PDMS micro-reactor is utilized. It include hosts, scaffolds etc. to increase surface area. A CVD coating is applied inside the channel. antibodies, ligands etc are selectively attached to each channel. Screening solution with tagged proteins flows in each channel and then there is a read out. It is possible to create complex geometries possible, applications for diagnostics, proteomics, drug screening. The fabrication of the microchannels is based on the techniques of soft lithography. The master used to cast the PDMS microchannel is fabricated using photolithographic technique. Photolithography seems to be the most convenient method for generating patterned microchannels. Once a master is fabricated, the channels are formed in PDMS by replica molding. Replica molding is simply the casting of prepolymer against a master and generating a negative replica of the master in PDMS. The PDMS is cured in an oven at 60° C. for 6 h at least, and the replica is then peeled from the master. Patterned depositions of materials in small (<100 $\mu$m) features is important for applications of miniaturized systems in biochemistry and cell biology. Patterned attachment of cells is also important in cell-based sensors where the reaction of cells to stimuli in specific areas of a device is necessary for detection of species of interest.

A solution of (+)biotinyl-3,6,9-trioxaundecanediamine (80% ethanol/20% DMF) is used to flow for 4 h through the microchannels which are coated with (1) reactive coating and (2) After flushing for 3. min with PBS containing 0.1%

(w/v) bovine serum albumin and 0.02% (v/v) Tween 20, a fluorescein-conjugate streptavidin solution is guided through the channel for 1 h.

Application 10

Polymer Based Optical Display Using Nanocrystals

Figure 6:
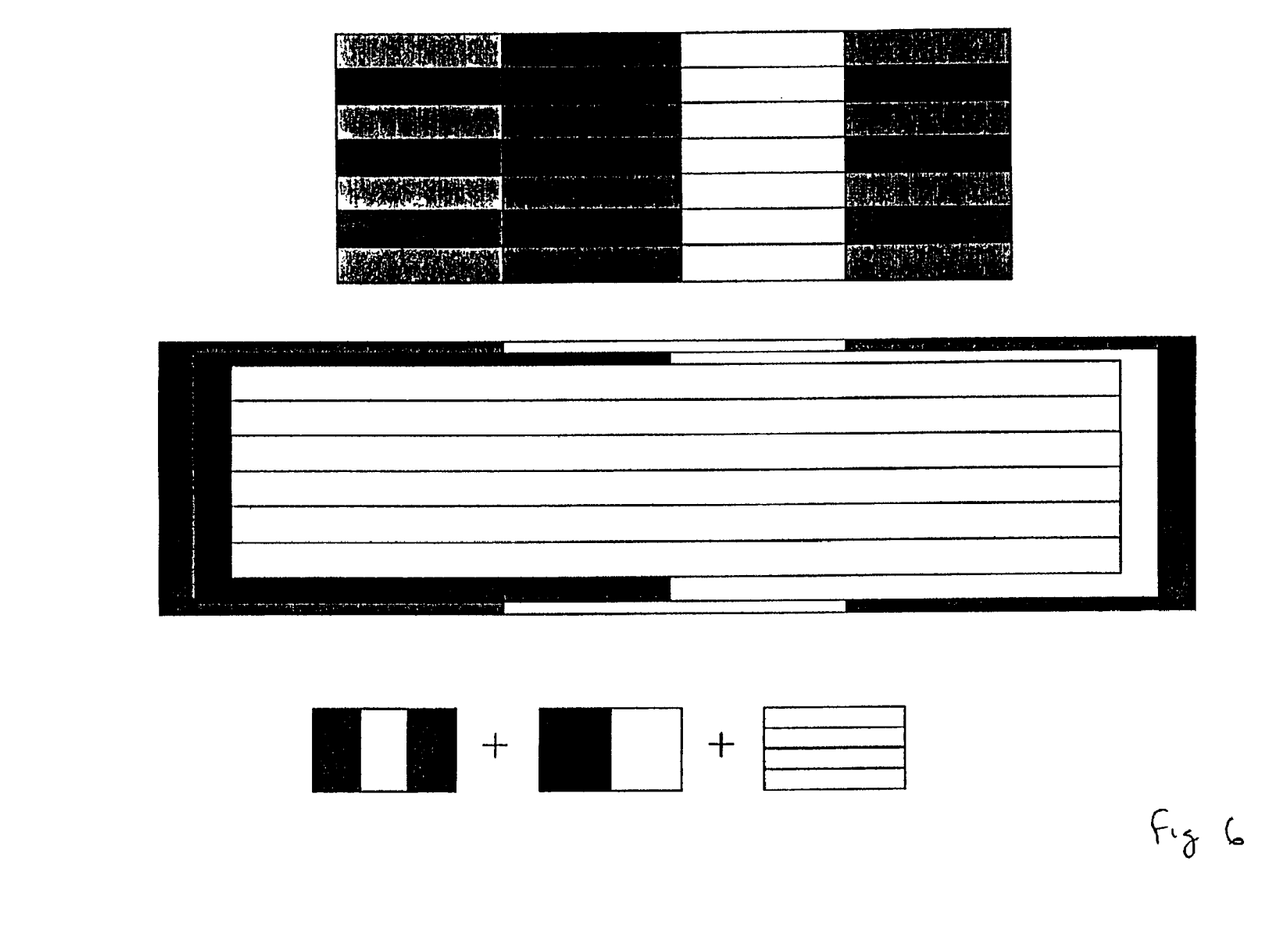
FIG. 6 is a schematic drawing of optical display device based on nanocrystals.
Figure 7:
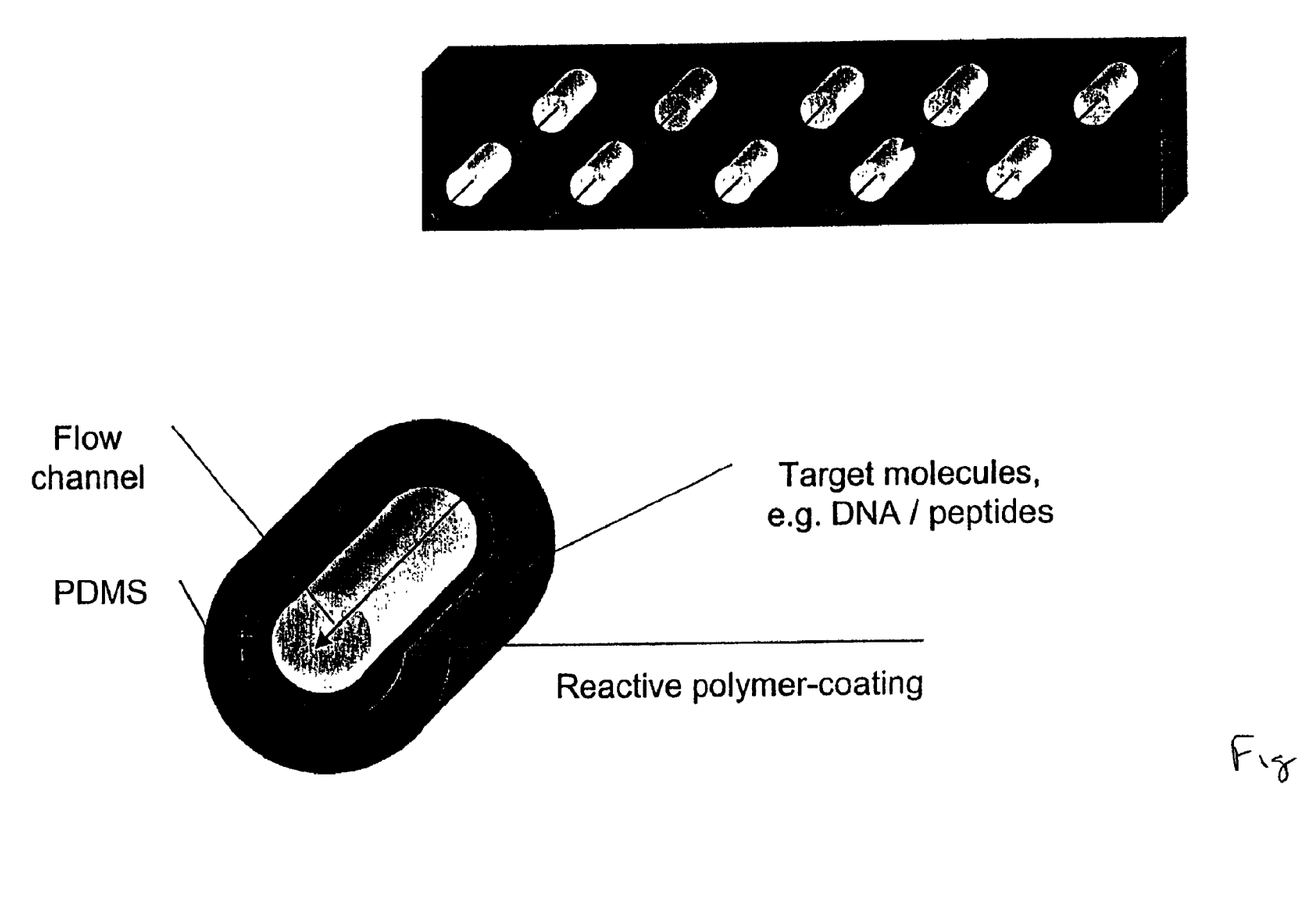
FIG. 7 is a schematic view of a channel micro-reactor for DNA/protein separation.

First a substrate is coated, e.g. Si wafer with active ester. Parts of the surface are coated with amino-biotin. The remaining parts are coated with amino-PEG (optional). Amino or alcohol terminated nanocrystals are attached defining a certain color, e.g. red. The steps are repeated using a different pattern and colors e.g. blue, yellow. A multi color flat display device with excellent brightness is devised. See FIGS. 6 and 7.

Waveguides for bioaffinity assays or surface-sensitive optical detection, can be prepared using CVD coating processes as described herein, including all of the benefits of the new process. The waveguide may include a patterned, reflective coated and an optically exposed region which is sensitive to analytes.

There are different types of electrophoresis methods including CE and MCE. Devices used in these methods again can be prepared by the CVD methods disclosed herein. The prepared substrates have coated patterns thereon and can be utilized to analyze micromixtures of a variety of biological cell types.

CVD methods may be used to prepare substrates having channels located therein. The channeled substrates can then be used in a method where charged entities are moved through the channel under influence of an applied voltage differential.

CVD processes can be used to prepare high-content and high-throughput screening. The method may include providing a base and preparing a micro-patterned chemical array using the CVD processes described herein. Unique characteristics of a so-designed device is the option of various instantly reacting functional groups, a defined and chemically stable polymer base layer with defined properties, non-degradability, the possibility to create activity gradients, and the feasibility for patterning.

Drug screening devices can advantageously be prepared using the CVD processes including coating at least one organic thin film onto all or a portion of a substrate. Then a plurality of patches can be coated in discrete known regions of the coated substrate surface. The coated devices can then be used to screen for the specific drugs.

Alternative applications may include decoltation of implantable devices, e.g. heart valves, pacemakers, stents, embolization coils, bone substitution, hip substitution, bone screws, vascular grafts, etc.; improved scaffold for tissue engineering; plates for in vitro cell culture; resins for proteins synthesis; resins for protein chemistry; microchip based diagnostic screenings; protein purification; DNA purification; DNA chips; protein chips; arrays of quantum dots; electro-optical devices; and coating of 3 dimensional structures such as membranes, micro-reactors, micro-channels, foams, scaffold, etc.

In addition, it is suitable for three-dimensional substrates; any substrate material, while SAM's are restricted two a few substrate materials; porous structures such as foams, scaffolds, membranes; applications in chemically aggressive environments such as in vivo; drug gradients possible; high-resistance coatings possible; thickness variable from some 20 nm to m and are easy to scale-up, are inexpensive and have high throughputs.

The substrates may be selected from silicon implants for gene testing, gold coated silicon for CP, -reactors, polymer surfaces for CP, coated microfabricated electrodes, glass slides, paper, metal sheets etc.

Although the present invention has been shown and described with respect to several preferred embodiments thereof, various changes, omissions and additions to the form and detail thereof, may be made therein, without departing from the spirit and scope of the invention. Therefore, it is the object of the claims to cover all such variations and modifications as come within the true spirit and scope of the invention.

What is claimed is:

1. A chemical vapor deposition process; said process includes coating a substrate with a reactive coating that includes repeating units selected from a group consisting of:

R: hydrogen atom, alkyl, aryl, benzyl, halogen, hydroxyl, alkoxyl

7

8

9

10

11

12

R₁, R₂, R₃, R₄, R₅ independently are: hydrogen atom, alkyl, aryl, benzyl

13

14

15

R: F, CH₃, CF₃, C₄F₉, CH₂CF₃, C₂F₅, (CH₂)$_n$NR′₂
(R′: hydrogen atom, alkyl, aryl, benzyl)

16

R: CH₃, H, CF₃, NO₂, Br, F, Cl, I

17

R₁, R₂, R₃, R₄ independently are: hydrogen atom, alkyl, aryl, benzyl, halogen, hydroxyl, alkoxyl, thiol, thioether, amino, nitro
n: 0 or 1
R₅: hydrogen atom, alkyl, alkenyl, benzyl, halogene, alkoxyl,

18

2. The chemical vapor deposition process of claim 1, wherein the deposited coating comprises at least one interface containing chemical groups having sufficient intrinsic chemical reactivity to react with target molecules.

3. The chemical vapor deposition process of claim 2, wherein the interfaces are based on poly[para-xylylenes]s or copolymers thereof.

4. The chemical vapor deposition process of the claim 2, wherein [2.2]paracyclophanes are polymerized during the chemical vapor deposition process.

5. The chemical vapor deposition process as defined in claim 2, wherein the coating is poly[para-xylylene carboxylic acid pentafluorophenolester-co-para-xylylene].

6. The chemical vapor deposition process of claim 2, wherein the coating includes interfaces containing functional groups, which are capable of reacting with functional groups of target molecules resulting in stable linkages.

7. The chemical vapor deposition process of claim 2, wherein the coating includes interfaces containing functional groups, where illumination with light was used to induce reaction with functional groups of target molecules resulting in stable linkages.

8. The chemical vapor deposition process of claim 2, wherein the surface of the coating is patterned by spatially restricted attachment of biotin-ligands.

9. The chemical vapor deposition process of claim 2, wherein the surface of the coating is patterned by spatially restricted attachment of peptides.

10. The chemical vapor deposition process of claim 2, wherein the surface of the coating is patterned by spatially restricted attachment of proteins.

11. The chemical vapor deposition process of claim 2, wherein the surface of the coating is patterned by spatially restricted attachment of oligonucleotides.

12. The chemical vapor deposition process of claim 2, wherein the surface of the coating is patterned by spatially restricted attachment of DNA.

13. The chemical vapor deposition process of claim 2, wherein the surface of the coating is patterned by spatially restricted attachment of polysaccharides.

14. The chemical vapor deposition process as claimed in claim 2, wherein a polymer interface containing chemical groups having sufficient intrinsic reactivity to react with target molecules is created and the chemical groups show an anisotropic distribution on the surface.

15. The chemical vapor deposition process as claimed in claim 14, wherein a gradient of reactivity is formed.

16. The chemical vapor deposition process as claimed in claim 2, wherein the deposited coating comprises co-polymers with at least two different types of chemical groups each having sufficient intrinsic reactivity to react with target molecules.

17. The chemical vapor deposition process as claimed in claim 2, wherein the deposited coating comprises co-polymers of at least one polymer with at least one type of chemical groups having sufficient intrinsic reactivity to react with target molecules and of at least one polymer that has no sufficient intrinsic reactivity to react with target molecules.

18. The chemical vapor deposition process as claimed in claim 17 wherein the polymer that has no sufficient intrinsic reactivity to react with target molecules is a poly(p-xylylene).

19. The chemical vapor deposition process as claimed in claim 17 wherein the polymer that has no sufficient intrinsic reactivity to react with target molecules is a functionalized poly(p-xylylene).

20. The chemical vapor deposition process as claimed in claim 17 wherein the polymer that has no sufficient intrinsic reactivity to react with target molecules is a poly(olefin).

21. Preparation of an electrophoresis chamber including depositing a polymer coating by the chemical vapor deposition as claimed in claim 2, said coating including functional groups to enhance surface properties.

22. The chemical vapor deposition process of claim 1, wherein photolithography is used to create immobilization pattern on a substrate.

23. The chemical vapor deposition of claim 1, wherein a coating is deposited onto a substrate, said process including:

providing purified [2.2]paracyclophane;

sublimating the [2.2]paracyclophane under a reduced pressure of less than 100 Pa;

heating the sublimated [2.2]paracyclophane to approximately 550° C.–900° C. to cleave C—C bonds to produce monomers;

polymerizing the monomers which are absorbed on the substrate at a temperature below 150° C. to produce a topologically uniform polymer coating.

24. The chemical vapor deposition process of claim 23, wherein the [2.2]paracyclophane comprises [2.2]paracyclophane 4-carboxylic acid pentafluorophenolester, and the sublimation of [2.2]paracyclophane 4-carboxylic acid pentafluorophenolester is conducted at a pressure of 0.2 mbar and at a temperature between 120 to 130° C. and the polymerization temperature is below 45° C.

25. The chemical vapor deposition process of claim 24 wherein the polymer coating is transparent.

26. The chemical vapor deposition process of claim 24, wherein the polymeric coating has a thickness between 40 and 2000 nm.

27. The chemical vapor deposition process of claim 1, wherein said coating is applied in a pattern on a substrate.

28. The chemical vapor deposition coating process as claimed in claim 1, wherein the coating is microstructured by subsequently stamping the surface of the coating to produce a pattern.

29. The chemical vapor deposition process of claim 1 wherein the surface of the coating is patterned using layer-by-layer adsorption.

30. The chemical vapor deposition process of claim 1, wherein (+)-biotinyl-3,6,9-trioxaundecanediamine was bound to poly[para-xylylen carboxylic acid pentafluorophenolester-co-para-xylylene] to create different patterns on the coating.

31. The chemical vapor deposition process as claimed in claim 1, further including masking a surface of the substrate to produce a patterned coating having defined areas, each area having different functional groups.

32. The chemical vapor deposition process as claimed in claim 1 further including a plasma treatment of the substrate prior to the chemical vapor deposition process.

* * * * *